US008575727B2

(12) United States Patent
Lim et al.

(10) Patent No.: US 8,575,727 B2
(45) Date of Patent: Nov. 5, 2013

(54) GATE STRUCTURES

(71) Applicant: Taiwan Semiconductor Manufacturing Company, Ltd., Hsin-Chu (TW)

(72) Inventors: Peng-Soon Lim, Johor (MY); Chia-Pin Lin, Hsinchu County (TW); Kuang-Yuan Hsu, Taichung County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/886,123

(22) Filed: May 2, 2013

(65) Prior Publication Data

US 2013/0240979 A1      Sep. 19, 2013

Related U.S. Application Data

(62) Division of application No. 13/599,507, filed on Aug. 30, 2012, now Pat. No. 8,441,107, which is a division of application No. 12/827,512, filed on Jun. 30, 2010, now Pat. No. 8,278,173.

(51) Int. Cl.
*H01L 29/06*      (2006.01)

(52) U.S. Cl.
USPC ........... 257/622; 257/288; 257/449; 257/639; 257/E21.363; 438/157; 438/268; 438/468

(58) Field of Classification Search
USPC .................. 257/48, 263–267, 328–344, 365, 257/E21.632, 347, 622, 499, 288; 438/268–270, 275–276, 468
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 * | 3/2007 | King et al. | 257/622 |
| 7,247,887 B2 | 7/2007 | King et al. | |
| 7,265,008 B2 | 9/2007 | King et al. | |
| 7,371,644 B2 | 5/2008 | Yagishita et al. | |

(Continued)

OTHER PUBLICATIONS

Tsung-Lin Lee, et al., U.S. Appl. No. 12/622,038, "Sacrificial Offset Protection Film for a Finfet Device," filed Nov. 19, 2009, 56 pages.

(Continued)

*Primary Examiner* — Dung A. Le
(74) *Attorney, Agent, or Firm* — Haynes and Boone, LLP

(57) ABSTRACT

A semiconductor device is provided. The device includes a semiconductor substrate, first and second projections extending upwardly from the substrate, the projections having respective first and second channel regions therein, and a first gate structure engaging the first projection adjacent the first channel region. The first gate structure includes a first dielectric material over the first channel region, a first opening over the first dielectric material and the first channel region, and a pure first metal with an n-type work function value conformally deposited in the first opening. The device also includes a second gate structure engaging the second projection adjacent the second channel region. The second gate structure includes a second dielectric material over the second channel region, a second opening over the second dielectric material and the second channel region, and a pure second metal with a p-type work function value conformally deposited in the second opening.

14 Claims, 17 Drawing Sheets

(56) References Cited

U.S. PATENT DOCUMENTS

| | | | |
|---|---|---|---|
| 7,508,031 | B2 | 3/2009 | Liu et al. |
| 7,528,465 | B2 | 5/2009 | King et al. |
| 7,605,449 | B2 | 10/2009 | Liu et al. |
| 7,859,065 | B2 | 12/2010 | Takeuchi et al. |
| 8,124,483 | B2 | 2/2012 | Schultz |
| 2005/0153490 | A1 | 7/2005 | Yoon et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0228372 | A1 | 10/2007 | Yang et al. |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |

OTHER PUBLICATIONS

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12,840,830, "High Surface Dopant Concentration Semiconductor Device and Method of Fabricating," filed Jul. 21, 2010, 21 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

Bartlomiej Jan Pawlak, et al., U.S. Appl. No. 12/569,689, "Method of Fabricating Finfet Device," filed Sep. 29, 2009, 21 pages.

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

\* cited by examiner

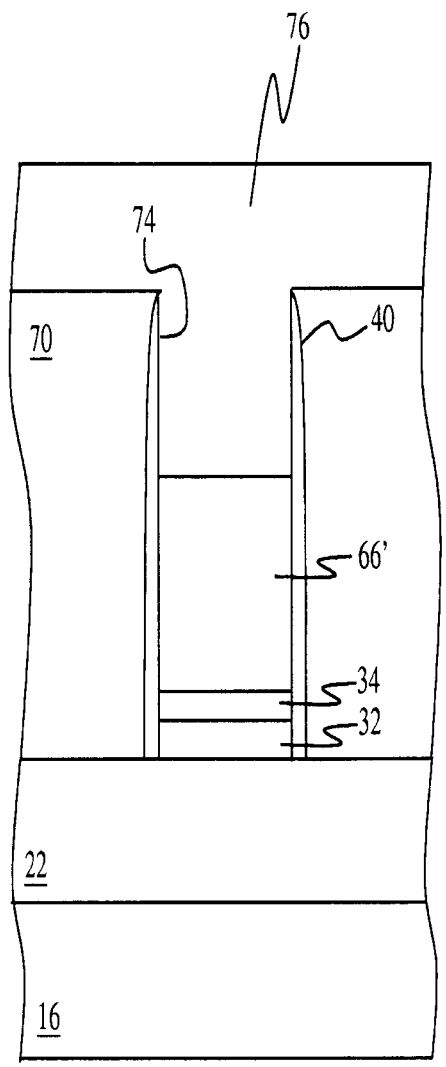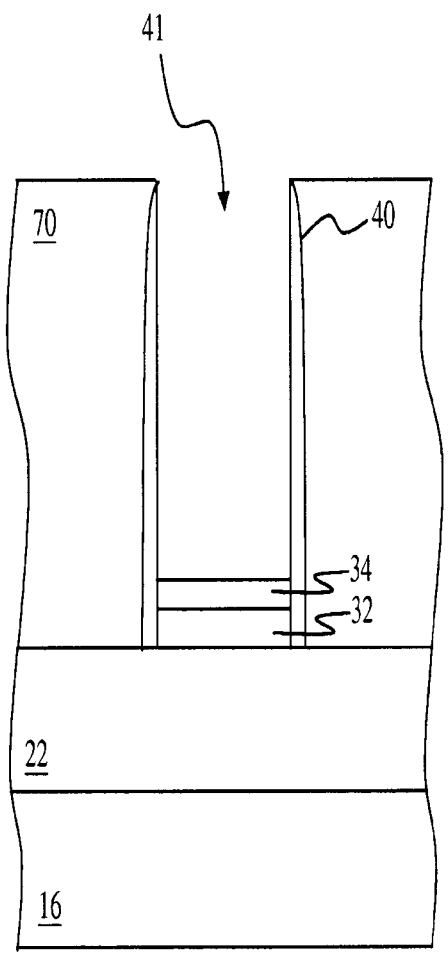
Figure 11                    Figure 12

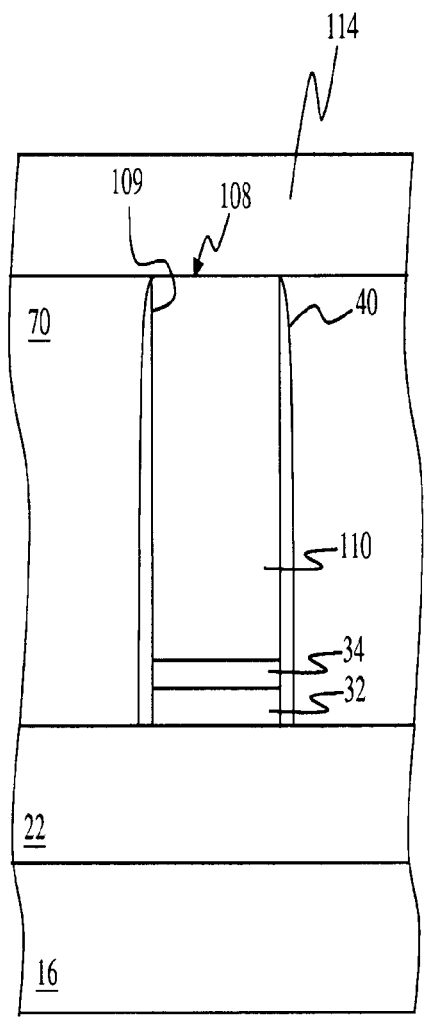
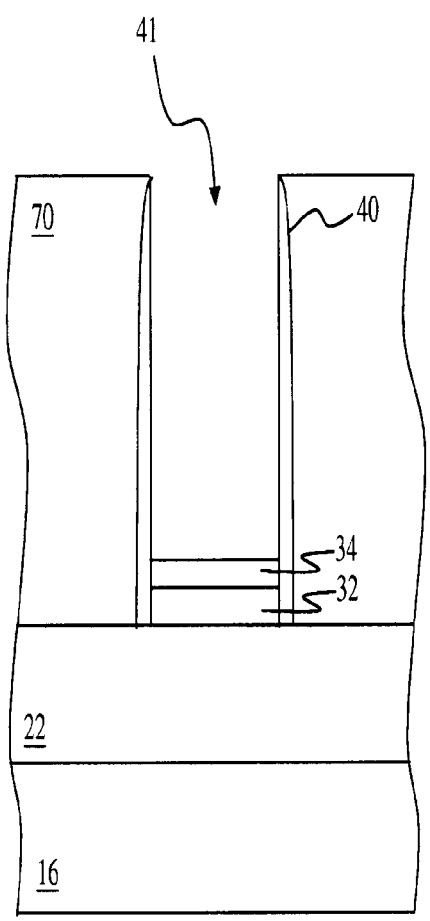
Figure 24
Figure 25

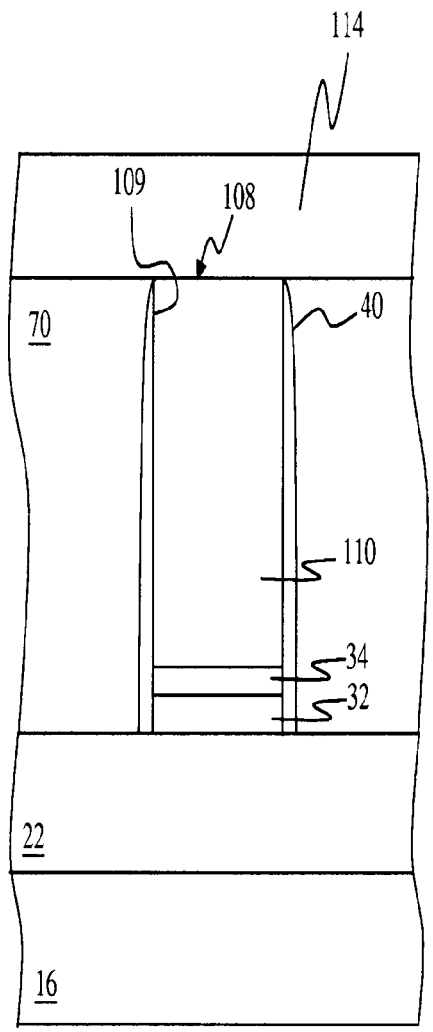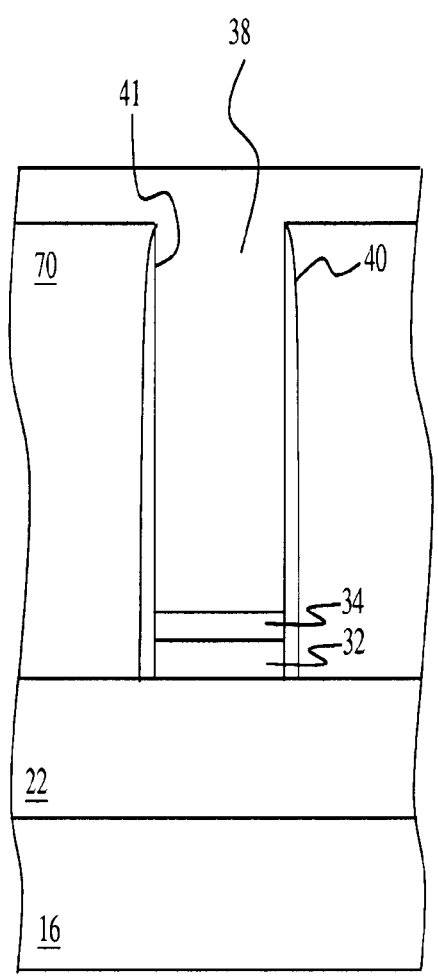
Figure 26
Figure 27

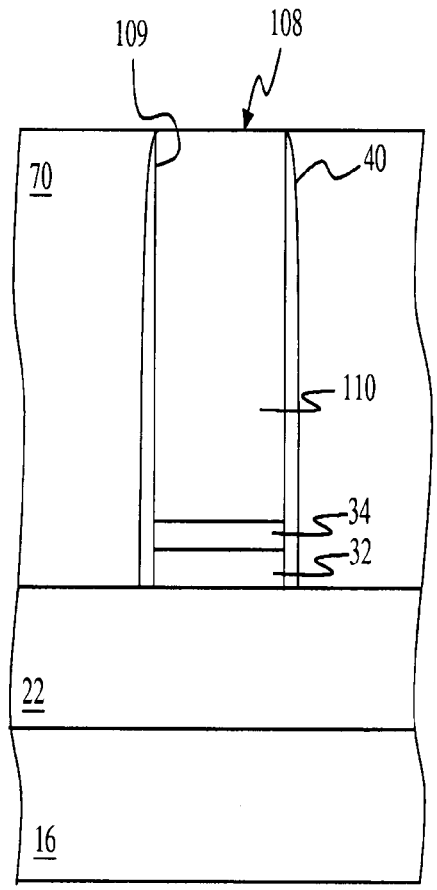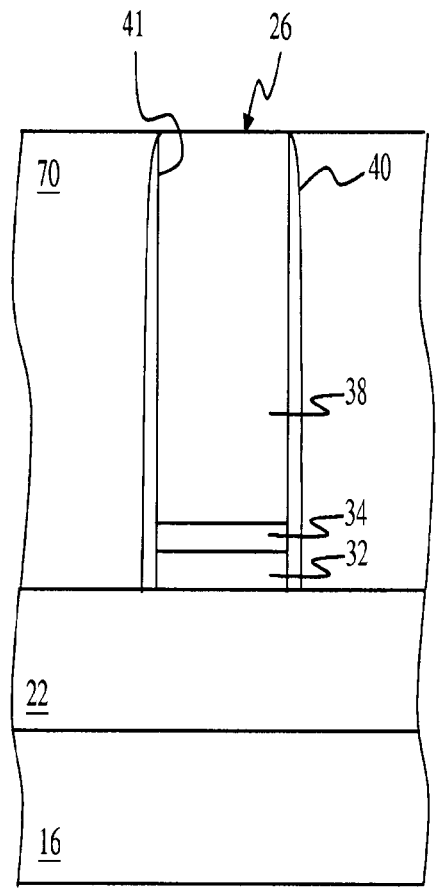
Figure 28                    Figure 29

GATE STRUCTURES

CROSS-REFERENCE

This application is a divisional of U.S. patent application Ser. No. 13/599,507, filed on Aug. 30, 2012, which, in turn, is a divisional of U.S. patent application Ser. No. 12/827,512, filed on Jun. 30, 2010, now U.S. Pat. No. 8,278,173, both of which are hereby incorporated by reference in their entireties.

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical 'fin' formed by etching spaced recesses into a substrate. The source, drain, and channel regions are defined within this fin. The transistor's gate is wrapped around the channel region of the fin, engaging it on both the top of the fin and the sides of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials. For example, high-k metal gate (HKMG) processes have been applied to FinFETs. However, HKMG devices often require multiple layers in the gate structure. For example, a plurality of layers may be used to tune the work function values of the metal gates. Although these approaches have been adequate for their intended purpose, they have not been satisfactory in all respects. For example, materials currently used as work function layers very often impart high resistivity to the gate stack. In short-channel devices in particular, gate resistance may degrade performance because the work function layer may constitute the bulk of the metal gate electrode, or even the entire metal gate electrode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5-6, 7-8, 9-10, 11-12, 13-14, and 15-16 are pairs of diagrammatic fragmentary sectional views similar to FIGS. 3 and 4 but showing the semiconductor device of FIG. 1 during various successive stages of manufacture.

FIGS. 20-21, 22-23, 24-25, 26-27, and 28-29 are pairs of diagrammatic fragmentary sectional views similar to FIGS. 18 and 19 but showing the semiconductor device of FIGS. 18 and 19 during various successive stages of manufacture.

DETAILED DESCRIPTION

The present disclosure relates generally to semiconductor devices, and more particularly, to a FinFET device and method of fabricating a FinFET device or portion of a device. It is understood, however, that specific embodiments are provided as examples to teach the broader inventive concept, and one of ordinary skill in the art can easily apply the teaching of the present disclosure to other methods or apparatus. In addition, it is understood that the methods and apparatuses discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed between the first and second features, such that the first and second features may not be in direct contact.

Figure 1:
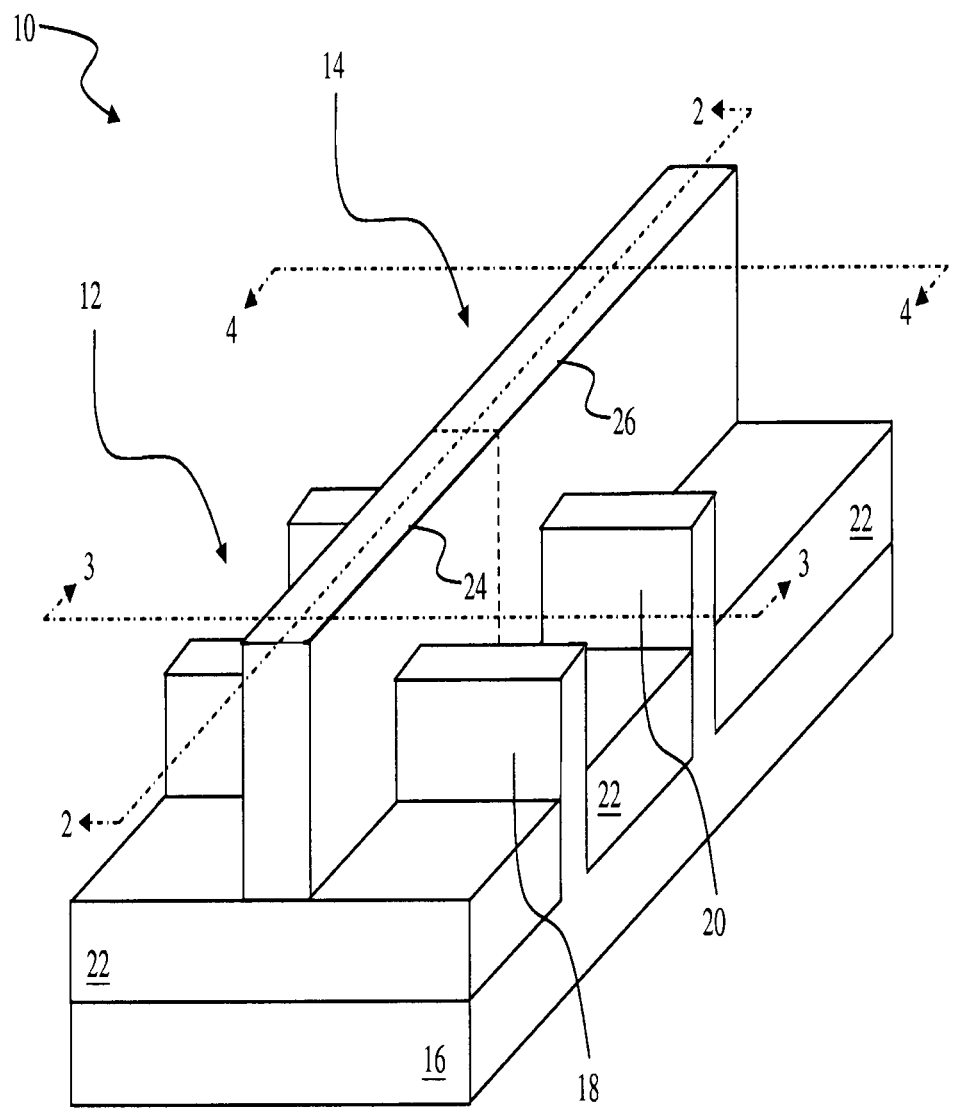
FIG. 1 is a diagrammatic fragmentary perspective view of a CMOS semiconductor device.

FIG. 1 is a diagrammatic fragmentary perspective view of a CMOS semiconductor device 10. The semiconductor device 10 is an integrated circuit that includes a fin-like n-channel metal-oxide-semiconductor field effect transistor (NMOS FinFET) 12 and a fin-like p-channel metal-oxide-semiconductor field effect transistor (PMOS FinFET) 14. NMOS FinFET 12 and PMOS FinFET 14 may alternatively be any type of fin-based transistor. The FinFETs 12 and 14 may be part of a microprocessor, memory cell (e.g., SRAM), and/or other integrated circuits.

The NMOS FinFET 12 and PMOS FinFET 14 are formed on a silicon semiconductor substrate 16. The substrate 16 may alternatively include other elementary semiconductors such as germanium, or include a compound semiconductor such as silicon carbide, gallium arsenide, indium arsenide, and indium phosphide. Alternatively, the substrate 16 may be a silicon-on-insulator (SOI) substrate. In such a case, the SOI substrate may be fabricated using separation by implantation of oxygen (SIMOX), wafer bonding, and/or other suitable methods.

The semiconductor device 10 includes fin structures (or projections) 18 and 20 that extend upwardly from the substrate 16 and form portions of the NMOS FinFET 12 and PMOS FinFET 14, respectively. Shallow trench isolation (STI) regions 22 surround the bottom portions of the fin structures 18 and 20 and prevent electrical interference or crosstalk. The STI regions 22 are composed of silicon oxide. Alternatively, they could be silicon nitride, silicon oxynitride, other suitable materials, and/or combinations thereof. It is understood that although two fin structures are illustrated, additional parallel fins may be formed from substrate 16 in a similar manner.

The semiconductor device 10 also includes gate structures 24 and 26 that overlay central portions of the fin structures 18 and 20, respectively. Gate structure 24 is a part of NMOS FinFET 12 and gate structure 26 is a part of PMOS FinFET 14. Further, gate structures 24 and 26 each include a plurality of layers which will be explained in more detail later. The gate structures 24 and 26 each engage three surfaces of respective fin structures 18 and 20—the top surface and two adjacent side surfaces.

The fin structures 18 and 20 and gate structures 24 and 26 of semiconductor device 10 are surrounded by an inter-level dielectric layer (ILD). But for the sake of clarity, semiconductor device 10 is depicted in FIG. 1 without this ILD.

Figure 2:
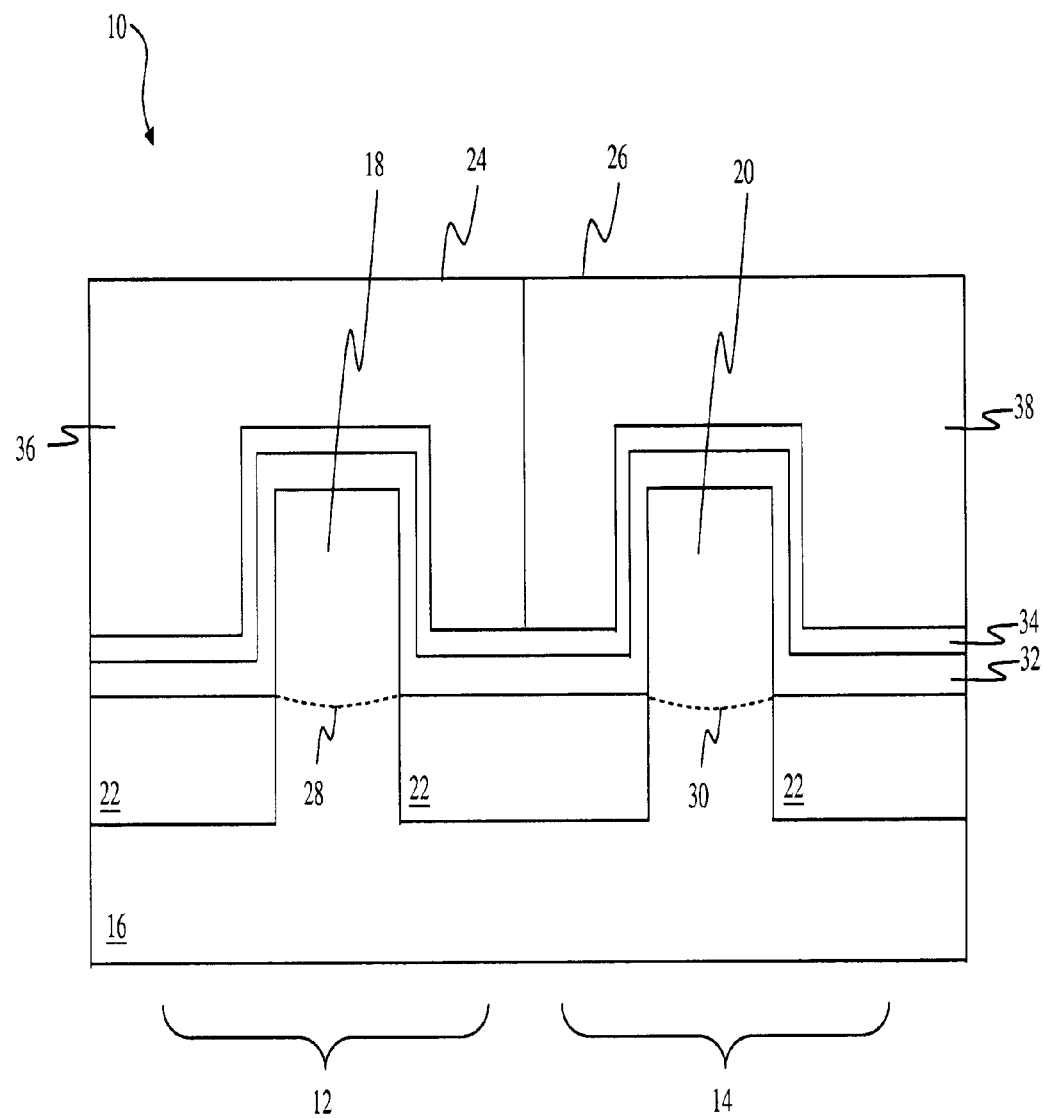
FIG. 2 is a diagrammatic fragmentary sectional view of the semiconductor device taken along line 2-2 in FIG. 1.

FIG. 2 is a diagrammatic fragmentary sectional view of the semiconductor device 10 taken along line 2-2 in FIG. 1. FIG. 2 depicts cross sections of the NMOS FinFET 12 and PMOS FinFet 14. The fin structure 18 includes a channel region 28 in the portion of the fin extending vertically higher than the STI regions 22. Optionally, the fin structure 18 may include not-illustrated epitaxial silicon (Si) growths on each side of the channel region 28. If the fin structure 18 includes the optional not-illustrated epitaxial Si growths, the channel region 28 will be tensile-strained. The fin structure 20 includes a channel region 30 in the portion of the fin extending vertically higher than the STI regions 22. Further, fin structure 20 may optionally include not-illustrated epitaxial silicon germanium (SiGe) growths on each side of the channel region 30. If the fin structure 20 includes the optional not-illustrated epitaxial SiGe growths, the channel region 30 will be compressive-strained.

As noted above, the gate structures 24 and 26 include a plurality of layers that form the gate portions of the FinFETs 12 and 14. In the lower-most portion of gate structures 24 and 26, a dielectric layer 32 overlays the STI regions 22 and the fin structures 18 and 20. The dielectric layer 32 engages the channel region 28 in the fin structure 18 on three sides and also engages the channel region 30 in the fin structure 20 on three sides. Here, the dielectric layer 32 is composed of a high-k dielectric material, such as hafnium oxide (HfOx). Alternatively, the dielectric layer 32 may include one or more other high-k dielectrics such as hafnium silicon oxide (HfSiO) or hafnium silicon oxynitride (HfSiON), or may be composed of a material with a standard dielectric constant, such as silicon oxide. Further, the dielectric layer 32 may be doped with elements such as Al, Ti, Ta, and/or La to adjust its dielectric constant. The dielectric layer 32 has a thickness in a range from about 1 to about 100 angstroms (Å). Although the dielectric layer 32 is illustrated as a single layer in FIG. 2, it may optionally include additional layers such as an interfacial layer of silicon oxide between the silicon of fin structures 18 and 20 and the remainder of the dielectric layer 32. A barrier layer 34 (also sometimes referred to as a capping layer, a diffusion layer, or an etch stop layer) is disposed above the dielectric layer 32. The barrier layer 34 is composed of titanium nitride (TiN) having a thickness in a range from about 5 to about 60 Å. Alternatively, the barrier layer 34 may include a metal carbide, TaN, or other material suitable to reduce or eliminate the risk of Fermi level pinning between the high-k material in dielectric layer 32 and nearby polysilicon layers.

The gate structure 24 includes a silicide 36 disposed above the barrier layer 34. The silicide 36 forms the electrode portion of the gate structure 24 and is composed of a silicide material with a low resistivity. In the present embodiment, the silicide material is a cobalt silicide, but alternatively it may be a nickel silicide or a platinum silicide, or other metal silicide with a low resistivity. Alternatively, the gate structure 24 may include a doped polysilicon layer disposed between the barrier layer 34 and the silicide 36.

The gate structure 26 includes a pure metal 38 disposed above the barrier layer 34. The pure metal forms the electrode portion of the gate structure 26 and is a low resistance metal with a p-type band edge effective work function value (p-metal). In the present embodiment, the p-metal 38 is cobalt, but alternatively it may be nickel or platinum or some other low resistance pure metal with a p-type band edge effective work function value. Further, the p-metal 38 is a conformal metal such that the metal contains minimal voids or other defects that may increase gate resistance.

Figures 3, 4:
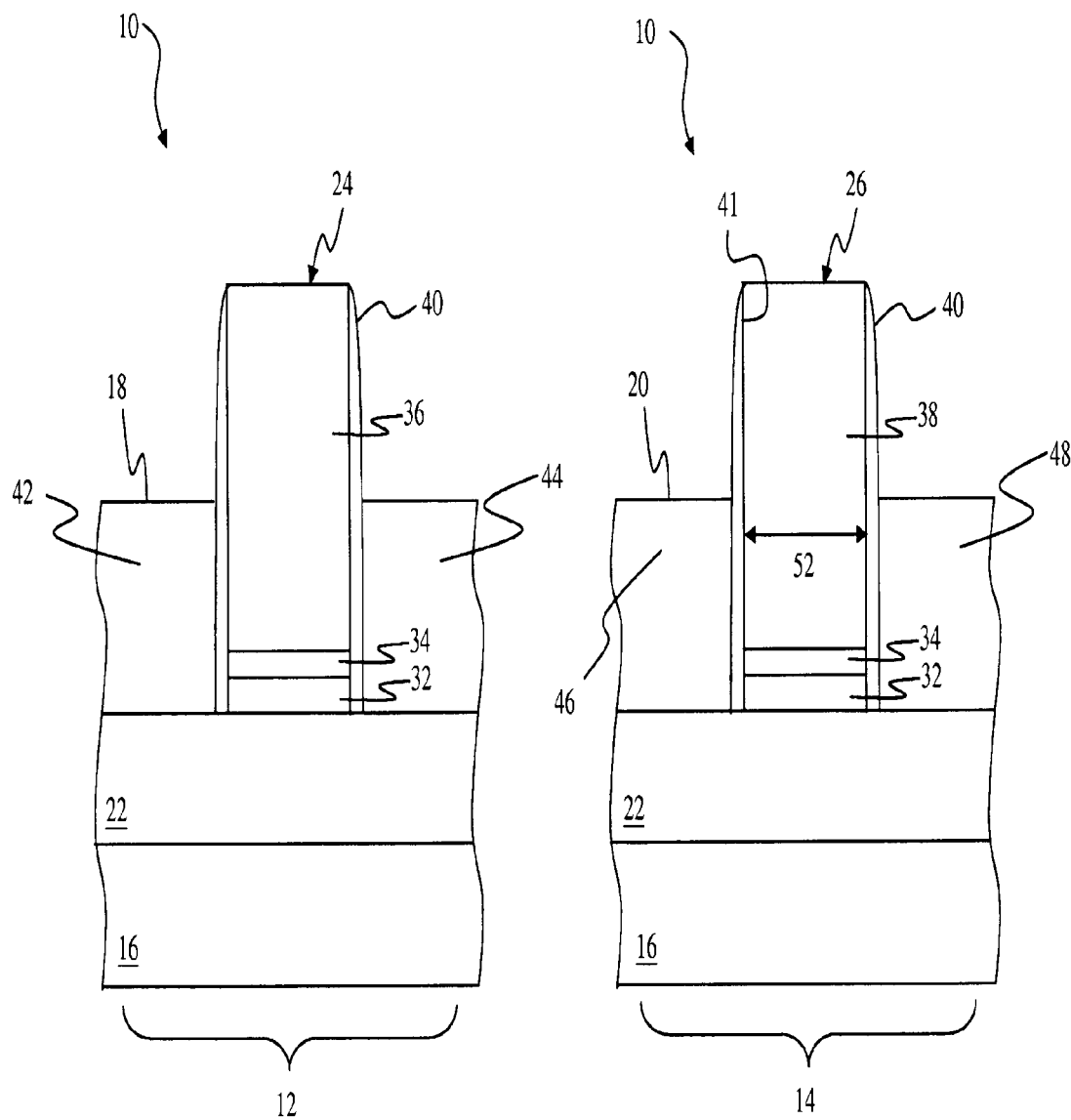
FIGS. 3-4 are diagrammatic fragmentary sectional views of the semiconductor device taken along lines 3-3 and 4-4 in FIG. 1, respectively.

FIGS. 3-4 are diagrammatic fragmentary sectional views of the semiconductor device 10 taken along lines 3-3 and 4-4 in FIG. 1, respectively. FIG. 3 depicts a cross-section of the gate structure 24 that is a portion of NMOS FinFET 12. And FIG. 4 depicts a cross-section of the gate structure 26 that is a portion of PMOS FinFET 14. The gate structure 24 includes two gate spacers 40 that abut each side of the dielectric layer 32, barrier layer 34, and silicide 36 and extend the full length of each. Similarly, the gate structure 26 includes two gate spacers 40 that abut each side of the dielectric layer 32, barrier layer 34, and p-metal 38 and extend the full length of each. The gate spacers 40 are composed of a dielectric material. Here, they are silicon nitride. Alternatively, the gate spacers may be silicon carbide, silicon oxynitride, other suitable materials, and/or combinations thereof.

The gate structure 26 includes an opening 41 with side surfaces defined by the gate spacers 40 and a bottom surface defined by the barrier layer 34. Portions of the opening 41 over the STI region 22 (as opposed to over the fin structure 20) have a high aspect ratio of approximately 3 or more. The opening 41 is completely filled with the p-metal 38.

A source region 42 and a drain region 44 are disposed in the fin structure 18 on opposite sides of the gate structure 24. The channel region 28 (FIG. 2) is interposed between the source and drain regions 42 and 44 in the fin structure 18. These source and drain regions are doped regions having a dopant incorporated therein that is appropriate for the design requirements of the FinFET 12. Here, because fin structure 18 is part of an NMOS device, source and drain regions 42 and 44 are doped with an n-type dopant such as phosphorus or arsenic, or combinations thereof. Similarly, a drain region 46 and a source region 48 are disposed in the fin structure 20 on opposite sides of the gate structure 26. The channel region 30 (FIG. 2) is interposed between the drain and source regions 46 and 48 in the fin structure 20. Because fin structure 20 is part of a PMOS device, source and drain regions 46 and 48 are doped with a p-type dopant such as boron.

In FIG. 4, the PMOS FinFET 14 is a short-channel device with a physical gate length 52. Short-channel devices such as PMOS FinFET 14 typically have a gate length of 60 nm or below. Because the gate length 52 is small and the vertical dimension of the gate structure 26 is large, the opening 41 formed during a gate replacement process has a high aspect ratio. Such openings in FinFET gate structures typically have an aspect ratio of approximately 3 or more. The formation of a metal gate electrode in a high aspect ratio opening presents challenges. For example, in short-channel devices, depositing a work function metal in a high aspect ratio opening may completely fill the opening even if that is not intended. Typical work function metals contain highly resistive nitrides that cause the overall FinFET gate resistance to be high, resulting in poor device performance. By conformally depositing a pure metal with low resistivity, such as the p-metal 38, during the FinFET gate replacement process, gate resistance may be reduced. Further, a conformal deposition process ensures the metal gate electrode will have minimal voids and other defects that may increase gate resistance. Conformal deposition processes typically fill high-aspect ratio openings in short-channel devices. However, even in short-channel devices, seams may sometimes result from a conformal metal fill.

FIGS. 5-6, 7-8, 9-10, 11-12, 13-14, and 15-16 are pairs of diagrammatic fragmentary sectional views similar to FIGS. 3 and 4 but showing the semiconductor device 10 during various successive stages of manufacture. The stages of manufacture depicted in FIGS. 5-16 correspond with fabrication of the semiconductor device 10 during a hybrid gate replacement process flow. In a hybrid process, the gate portion of the NMOS FinFET 12 is partially formed with a gate first process and the gate portion of the PMOS FinFET 14 is formed with a gate last process. It should be understood that additional processes may be provided before, during, and/or after the stages illustrated in FIGS. 5-16, and that some selected processes may only be briefly described if they are well known in the art.

Figures 5, 6:
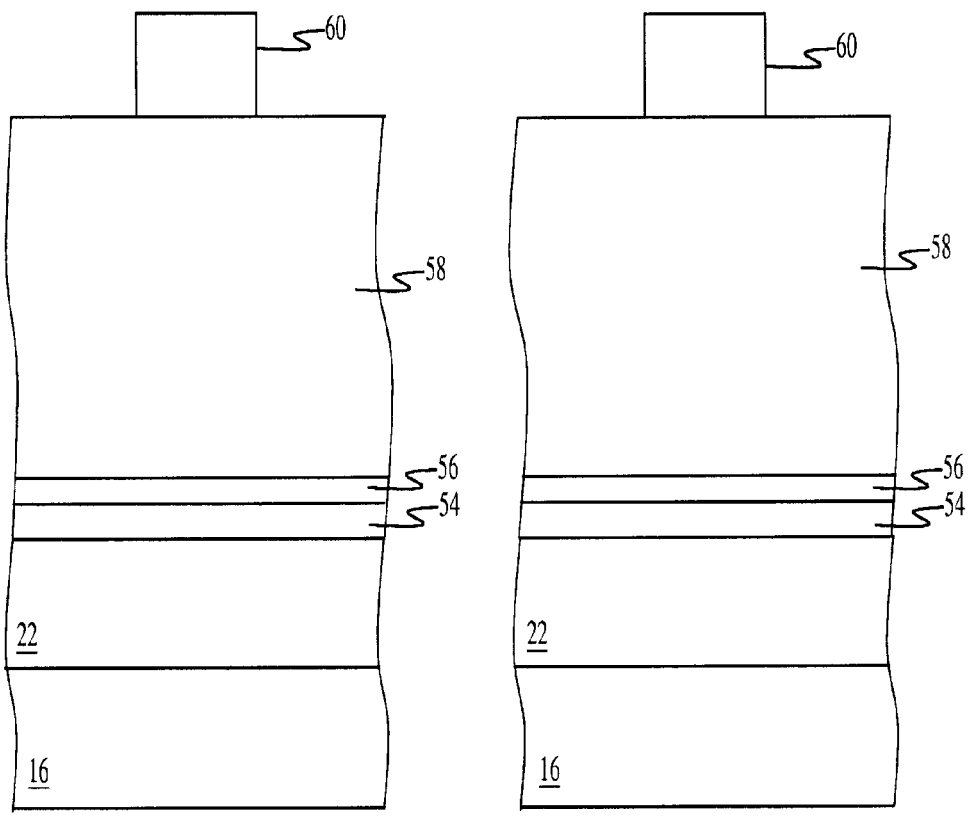

Referring to FIGS. 5 and 6, the silicon semiconductor substrate 16 is provided. The fin structures 18 and 20 (FIGS. 1-4) are formed from the substrate 16 using suitable processes including photolithography and etch processes. The photolithography processes include forming a photoresist layer (resist) overlying the substrate 16, exposing the resist to a pattern, performing post-exposure bake processes, and developing the resist to form a masking element. The masking element is then used to etch recesses into the substrate 16, leaving the fin structures 18 and 20. The recesses forming fin structures 18 and 20 may be etched using reactive ion etch (RIE) and/or other suitable processes. Alternatively, the fin structures may be formed by double-patterning lithography (DPL) process. DPL allows for enhanced feature (e.g., fin) density. Various DPL methodologies may be used, including double exposure (e.g., using two mask sets), forming spacers adjacent features and removing the features to provide a pattern of spacers, resist freezing, and/or other suitable processes. After the fin structures 18 and 20 are formed, silicon dioxide or other suitable dielectric is deposited and etched to form the shallow trench isolation (STI) regions 22 that surround and isolate the fin structures. This may be accomplished by any suitable process, which may include dry etching, wet etching, and a chemical vapor deposition process.

Next, a dielectric layer 54 with a thickness in the range of about 1 to 100 Å is formed over the fin structures 18 and 20 (FIGS. 1-4) and the STI regions 22. The dielectric layer 54 is composed of a high-k dielectric material, HfOx, and is deposited using chemical vapor deposition (CVD). The high-k material of dielectric layer 54 is deposited on all portions of the fin structures 18 and 20 above the STI regions 22, including the top and side portions. Next, a barrier layer 56 of TiN is deposited by CVD over the dielectric layer 54 to a thickness in a range of about 5 to 60 Å. A polysilicon layer 58 is then formed by CVD over the barrier layer 56. The polysilicon is deposited to a thickness in a range of about 50 to 1600 Å. After the polysilicon is deposited, it is doped to adjust the work function value of the associated NMOS FinFET 12. The layers 54, 56, and 58 may each alternatively be formed using any other suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. Also, a photoresist layer is deposited over the layer 58 and patterned in a known manner to leave portions 60 that facilitate removal of portions of the layer stack in subsequent steps.

Figure 7:
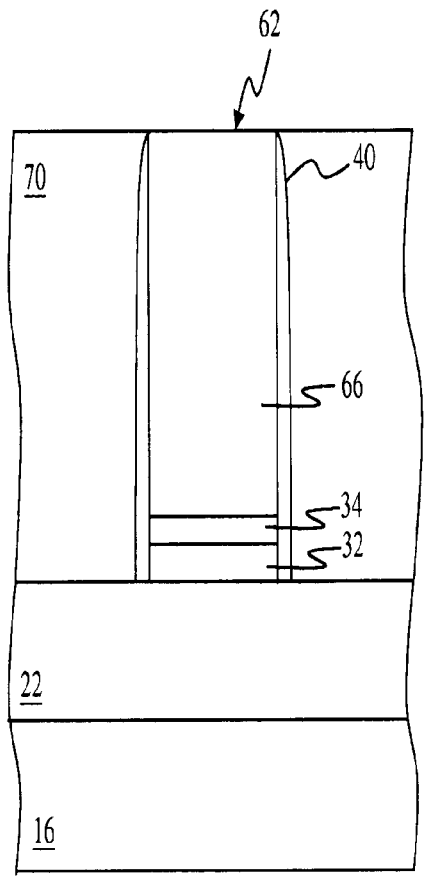
Figure 8:
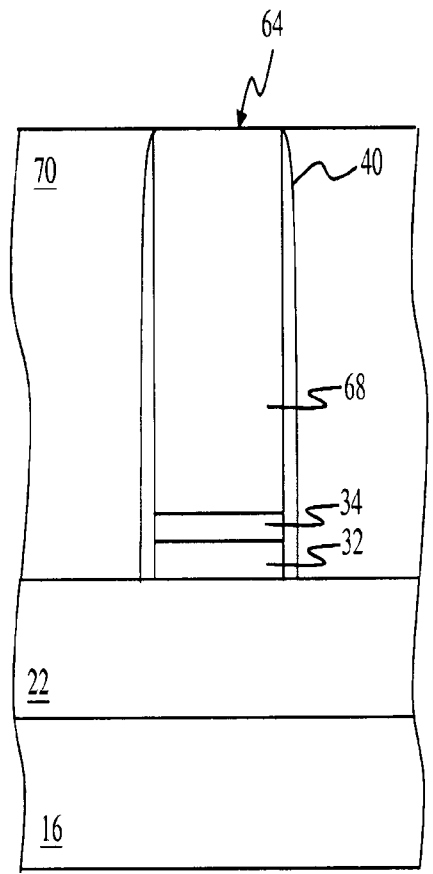

Referring now to FIGS. 7 and 8, photolithography patterning processes are employed to form an interim gate structure 62 and an interim gate structure 64, by removing the portions of the layers 54, 56, and 58 that are not protected by the photoresist portions 60 (FIGS. 5-6). After patterning, the dielectric layer 32 (a portion of layer 54), the barrier layer 34 (a portion of layer 56), and a polysilicon layer 66 (a portion of layer 58) remain over fin structure 18 (FIGS. 1-4), and form the interim gate structure 62. And the dielectric layer 32 (a portion of layer 54), the barrier layer 34 (a portion of layer 56), and a dummy polysilicon layer 68 (a portion of layer 58) remain over the fin structure 20 (FIGS. 1-4), and form the interim gate structure 64. The photolithography patterning process used to form the gate structures may include any number of suitable steps, such as photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. The etching processes include dry etching, wet etching, and/or other etching methods. It is understood that the above example does not limit the processing techniques that may be utilized to form the layers discussed above. After patterning the layers over the fin structures 18 and 20, known processes are employed to form the spacers 40 along the sides of the interim gate structures 62 and 64. After deposition and etching, the spacers 40 protect two approximately vertical sides of each interim gate structure 62 and 64, the vertical sides being approximately perpendicular to the fin structures 18 and 20.

Next, an interlayer (or inter-level) dielectric (ILD) layer 70 is next formed over the semiconductor device 10, including interim gate structures 62 and 64. The ILD layer 70 is composed of a dielectric such as silicon oxide. The ILD layer 70 initially has a greater thickness than that shown in FIGS. 7 and 8. Subsequent to the deposition of the ILD layer 70, a chemical mechanical polishing (CMP) process is performed, until a top portion of each interim gate structure 62 and 64 is exposed, as shown in FIGS. 7 and 8.

Figure 9:
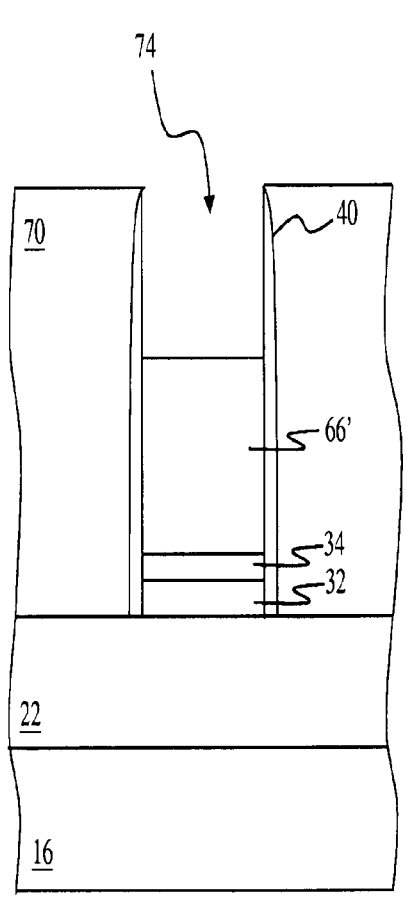
Figure 10:
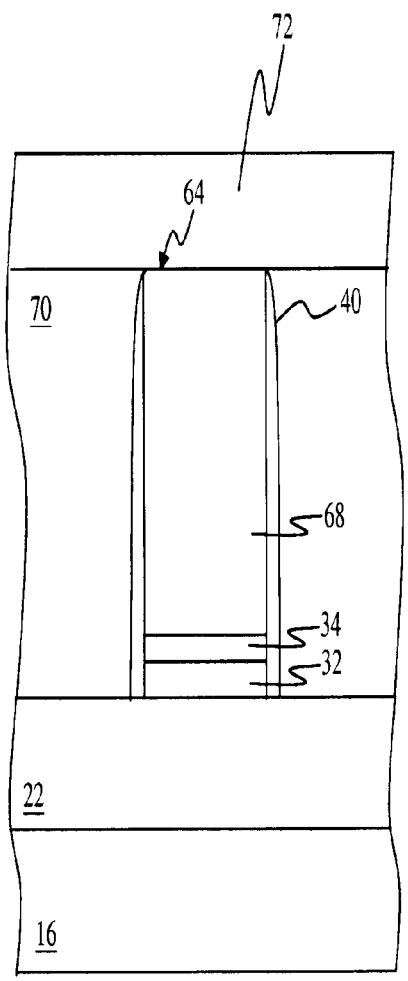

Referring now to FIGS. 9 and 10, a patterned photoresist layer 72 is formed over a portion of the semiconductor device 10 to protect the interim gate structure 64. Subsequently, a portion of the polysilicon layer 66 is removed to form an opening 74, leaving a portion 66' of the original layer 66. The polysilicon is removed with a wet etch process that includes exposing the polysilicon to a hydroxide solution such as ammonim hydroxide. Alternatively, the polysilicon of layer 66 may be removed by a dry etching process or any other suitable removal process.

Referring now to FIGS. 11 and 12, the patterned photoresist layer 72 (FIG. 10) is removed and a second patterned photoresist layer 76 is formed over the semiconductor device 10 to protect the remaining portion 66' of the polysilicon layer. Subsequently, the dummy polysilicon layer 68 (FIG. 10) is etched away to form the opening 41. Portions of the opening 41 over the STI regions 22 have a high-aspect ratio of approximately 3 or above. The photoresist layer 76 is then removed. The photoresist layers 72 and 76 used in the patterning process described above may alternatively be replaced with other types of protective materials such as spin-on-glass (SOG).

Figure 13:
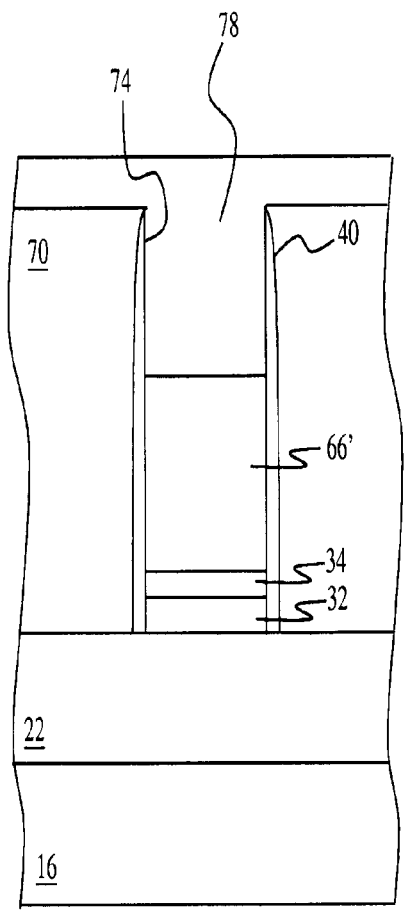
Figure 14:
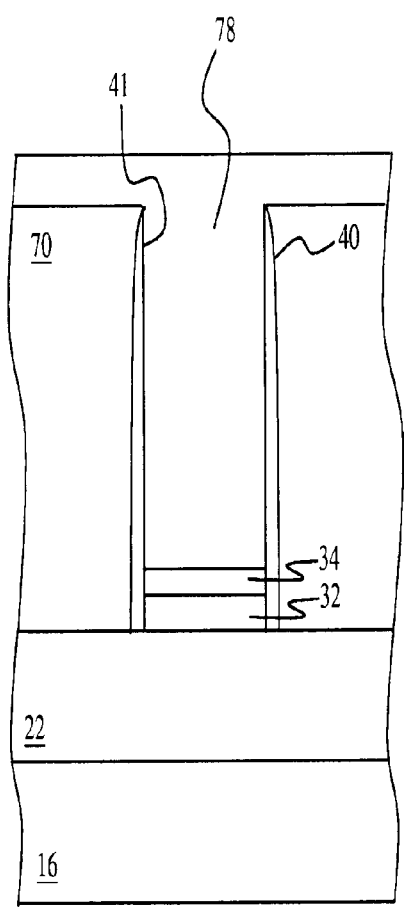

Referring now to FIGS. 13 and 14, a layer 78 of a pure p-metal is deposited in the openings 74 and 41 to simultaneously form the gate electrodes of the FinFETs 12 and 14. The pure p-metal of the layer 78 is identically the same p-metal shown at 38 in FIG. 4. The p-metal layer 78 is deposited by a conformal process such that minimal voids remain in the metal after deposition. Because the FinFET 14 is a short-channel device, the p-metal layer 78 should completely fill the opening 41. However, as mentioned above, it is possible a seam may be observed after the conformal metal fill. In the present embodiment, cobalt is conformally deposited with chemical vapor deposition (CVD) or one of its variants including: high density plasma CVD (HDPCVD), metal organic CVD (MOCVD), remote plasma CVD (RPCVD), and plasma enhanced CVD (PECVD). Alternatively, the p-metal may be nickel or platinum or any other pure p-metal with low resistivity and a band edge p-type work function. And the conformal process may be atomic layer deposition (ALD) or any other process suitable to fill the openings with minimal voids.

Figure 15:
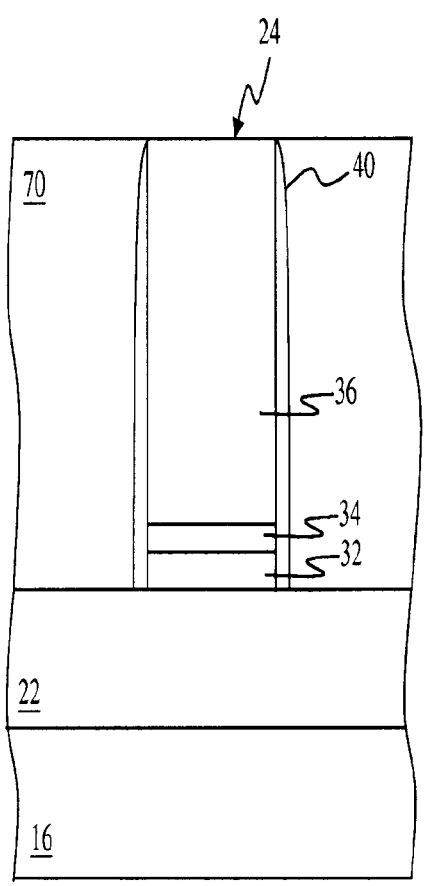
Figure 16:
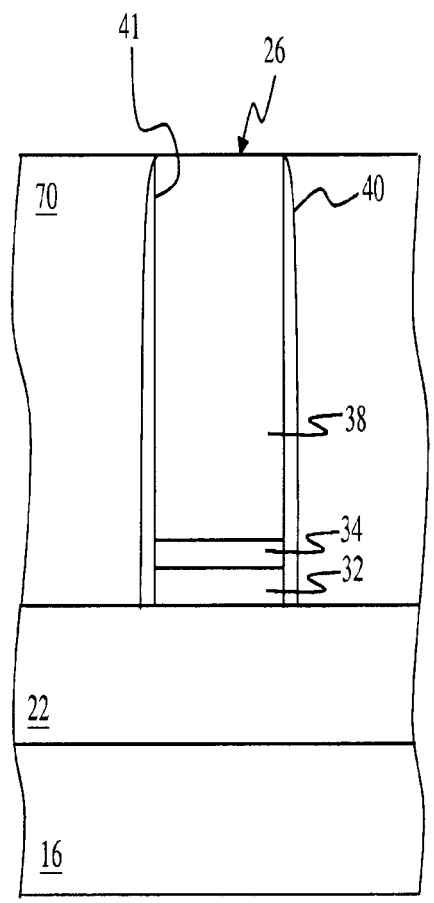

Referring now to FIGS. 15 and 16, a CMP is performed to remove portions of the p-metal layer 78 outside of the openings 74 and 41. During subsequent processing, the semiconductor device 10 may undergo heat treatments, and as a result the remaining portion 66' of the polysilicon layer and the p-metal of layer 78 disposed in the opening 74 will undergo a silicidation process to create the silicide 36. In the current embodiment, the entirety of the polysilicon portion 66' has reacted with the p-metal of layer 78 and thus gate structure 24 contains a fully silicided electrode 36. However, depending on the time and temperature of the heat treatments in the subsequent processing, some portion of the polysilicon layer 66' may not react with the p-metal of layer 78 and may remain in the final gate structure 24 between the barrier layer 34 and the silicide layer 36.

It is understood that the semiconductor device 10 will undergo further processing to complete fabrication. For example, a not-illustrated multilayer interconnection (MLI) including metal layers (e.g., M1, M2, etc.) and inter-metal dielectric (IMD) will be formed above fin and gate structures 18, 20, 24, and 26 in order to electrically couple various device parts to form an integrated circuit. The multilayer interconnection includes vertical interconnects, such as conventional vias or contacts, and horizontal interconnects, such as metal lines. The various interconnection features may utilize various conductive materials including copper, tungsten and silicide. In one example, a damascene process is used to form copper multilayer interconnection structure.

Figure 17:
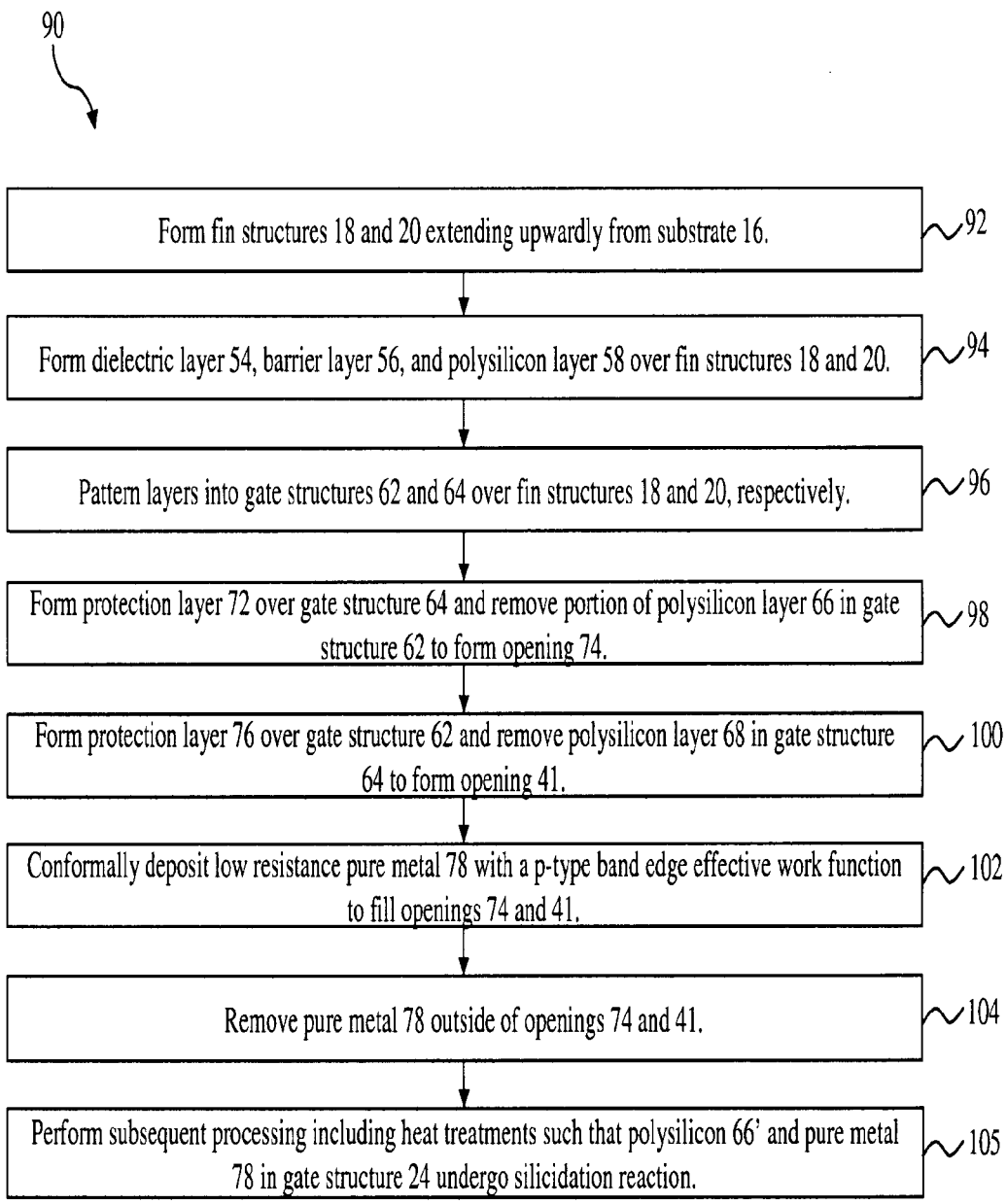
FIG. 17 is a high-level flowchart showing a process that is described in association with FIGS. 5-16.

FIG. 17 is a high-level flowchart showing the hybrid gate replacement process 90 that was described above in association with FIGS. 5-16. Process 90 begins at block 92 where the fin structures 18 and 20 are formed from the substrate 16. The STI regions 22 are formed after the fin structures are formed. The process 90 proceeds to block 94 where the dielectric layer 54, the barrier layer 56, and the polysilicon layer 58 are formed over the fin structures 18 and 20. Then, in block 96, the layers formed in block 94 are patterned into the interim gate structures 62 and 64. The interim gate structure 62 overlays the channel region 28 of the fin structure 18 and the interim gate structure 64 overlays the channel region 30 of the fin structure 20. Also, the ILD layer 70 is deposited over the semiconductor device 10 and a CMP is performed to expose the top portions of the gate structures 62 and 64. Process 90 proceeds to block 98 where the patterned photoresist layer 72 is formed over the interim gate structure 64, and a portion of the polysilicon layer 66 is removed to form the opening 74. The photoresist layer 72 is then removed. Then, in block 100 the patterned photoresist layer 76 is formed over the remaining polysilicon portion 66' and the dummy polysilicon layer 68 in the interim gate structure 64 is completely removed to form the opening 41. The photoresist layer 76 is then removed. Next, in block 102, the low resistance pure metal 38 with a p-type band edge effective work function is conformally deposited in the openings 74 and 41. Process 90 proceeds to block 104 where the p-metal 78 outside of the openings 74 and 41 is removed. Finally, in block 105, subsequent processing is performed which may include heat treatment steps. During such heat treatments, the remaining polysilicon material 66' and the pure p-metal of layer 78 in the opening 74 will react to form the silicide 36.

The hybrid gate replacement process depicted in FIGS. 5-16 is not limited to the aspects of the process described above. For example, the removal of the polysilicon material from the interim gate structures may occur in a different order. Further, the openings 74 and 41 may be formed sequentially and the sequence of PMOS and NMOS FinFET formation may be reversed. Also, if the PMOS FinFET 14 is a long-channel device, the opening 41 may be significantly larger and the time required to conformally fill the opening with the p-metal of layer 78 may be prohibitive. In such a case, the deposition of p-metal 78 may only partially fill opening 41 (creating a seam) and an additional deposition step may be used to fill the remainder of opening 41. Specifically, a conductive fill metal such as aluminum may be deposited over the p-metal 38 to fill the remainder of opening 41 and form the gate structure. This additional deposition may be carried out by physical vapor deposition (PVD) or other suitable deposition process.

Figures 18, 19:
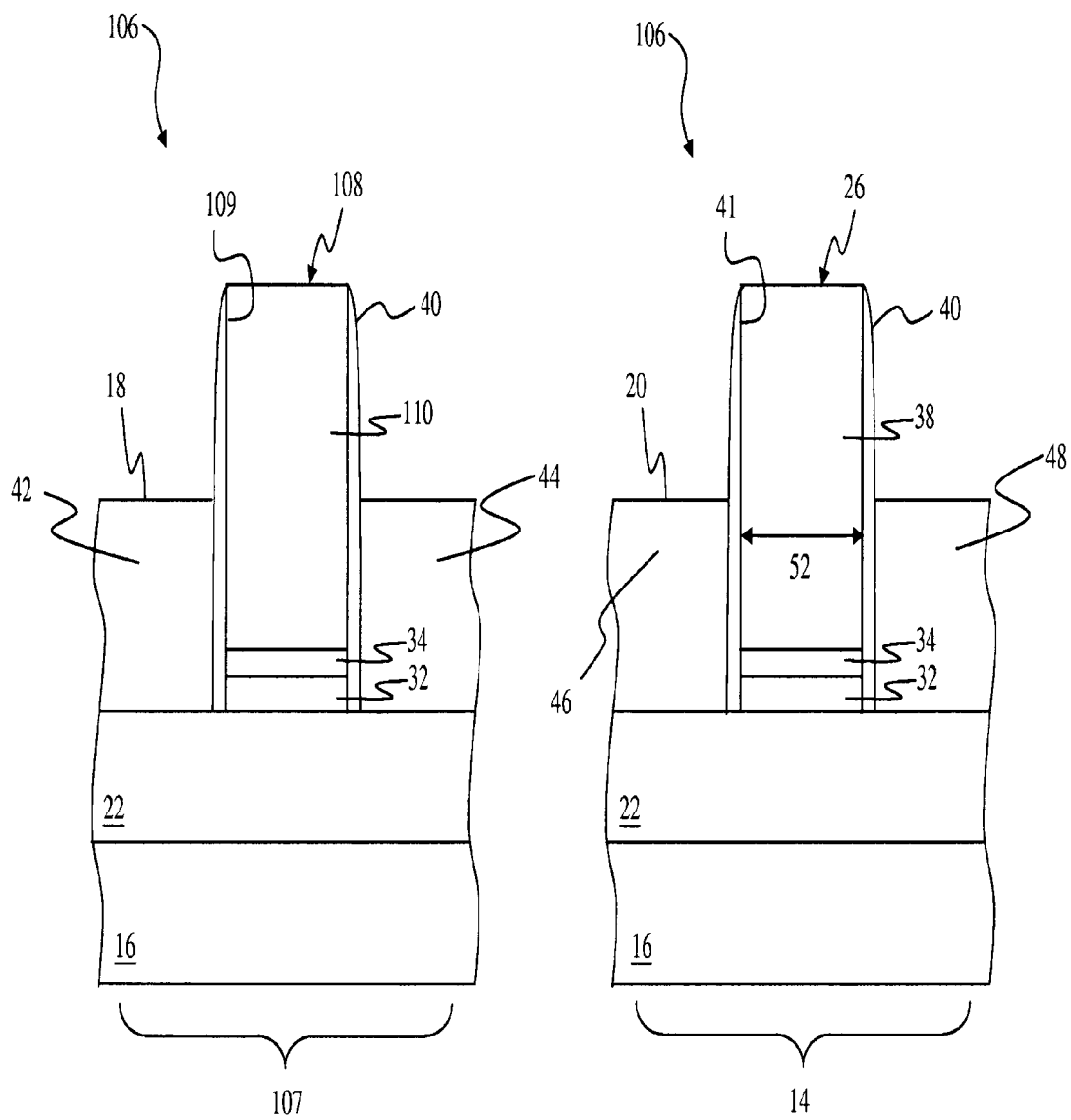
FIGS. 18 and 19 are diagrammatic fragmentary sectional views similar to FIGS. 3 and 4 but showing a semiconductor device that is an alternative embodiment of the semiconductor device shown FIGS. 1-4.

FIGS. 18 and 19 are diagrammatic fragmentary sectional views similar to FIGS. 3 and 4 but showing a semiconductor device 106 that is an alternative embodiment of the semiconductor device 10 shown FIGS. 1-4. The semiconductor device 106 is similar to the semiconductor device 10 except for the differences described below. Similar aspects of the semiconductor devices in FIGS. 3 and 4 and FIGS. 18 and 19 are numbered the same for the sake of clarity.

The semiconductor device 106 is an integrated circuit that includes NMOS FinFET 107. The NMOS FinFET 107 may alternatively be any type of fin-based transistor. The semiconductor device 106 also includes a gate structure 108 that overlays a central portion of the fin structure 18. The gate structure 108 is part of the NMOS FinFET 107 and includes a plurality of layers that form the gate portion of the FinFET. The gate structure 108 includes an opening 109 with side surfaces defined by the gate spacers 40 and a bottom surface defined by the barrier layer 34. Portions of the opening 41 over the STI region 22 (as opposed to over the fin structure 18) have a high aspect ratio of approximately 3 or more. Disposed in the opening 109 is a low resistance pure metal 110 with an n-type band edge effective work function value (n-metal). In the present embodiment the pure n-metal 110 is aluminum, but alternatively it may be tantalum or some other low resistance pure metal with a n-type band edge effective work function value. Further, the n-metal 110 is a conformal metal such that the metal completely fills the opening 109, and thus contains minimal voids or other defects that may increase gate resistance.

Figure 20:
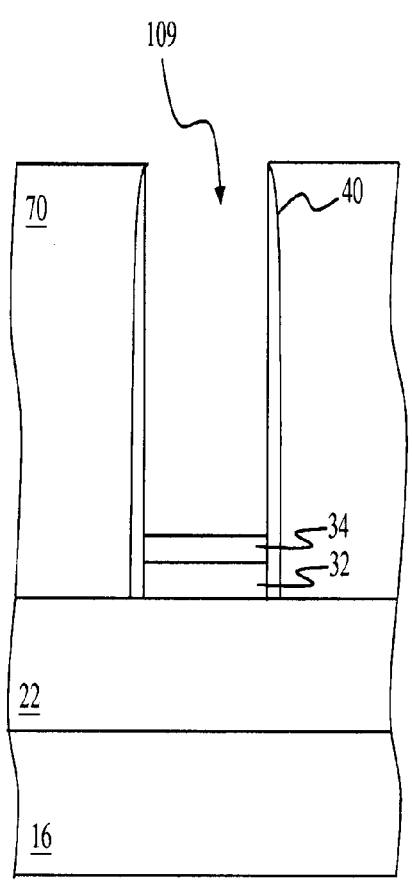
Figure 21:
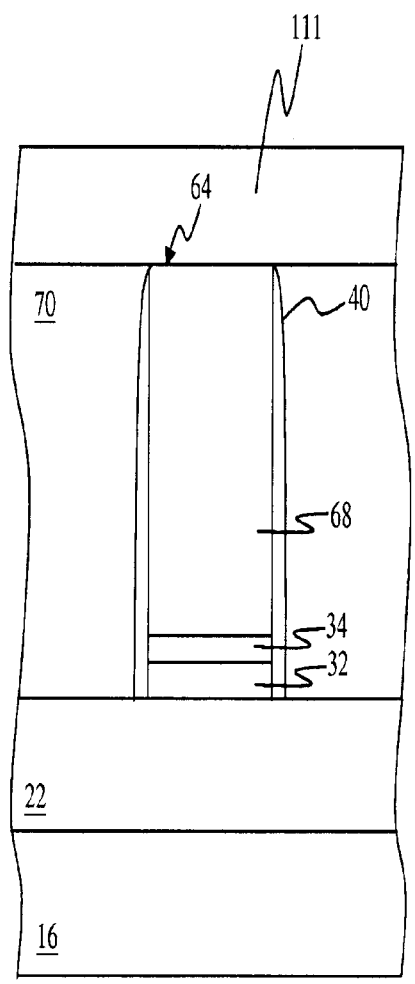

FIGS. 20-21, 22-23, 24-25, 26-27, and 28-29 are pairs of diagrammatic fragmentary sectional views similar to FIGS. 18 and 19 but showing the semiconductor device 106 during various successive stages of manufacture. The stages of manufacture depicted in FIGS. 20-29 are similar to the stages of manufacture depicted in FIGS. 5-16, except that in FIGS. 20-29 a fully gate last process flow is depicted. That is, the gate portions of both FinFETs 107 and 14 are formed using a gate last process. The stages of manufacture for both processes are similar up to the stage depicted by FIGS. 7 and 8. Thus, FIGS. 20 and 21 depict a stage of manufacture of the fully gate last process following the stage depicted in FIGS. 7 and 8. Similar aspects of FIGS. 5-16 and FIGS. 20-29 are numbered the same for the sake of clarity. It should be understood that additional processes may be provided before, during, and/or after the stages illustrated in FIGS. 20-29, and that some selected processes may only be briefly described if they are well known in the art.

Referring now to FIGS. 20 and 21, a patterned photoresist layer 111 is formed over a portion of the semiconductor device 14 to protect the interim gate structure 64. Subsequently, the polysilicon layer 66 (FIG. 7) is completely removed to form opening 109. Portions of the opening 109 over the STI regions 22 have a high-aspect ratio of approximately 5 or more. The polysilicon material is removed with a wet etch process that includes exposing the polysilicon to a hydroxide solution such as ammonium hydroxide. Alternatively, the polysilicon of layer 66 may be removed by a dry etching process or any other suitable removal process.

Figures 22, 23:
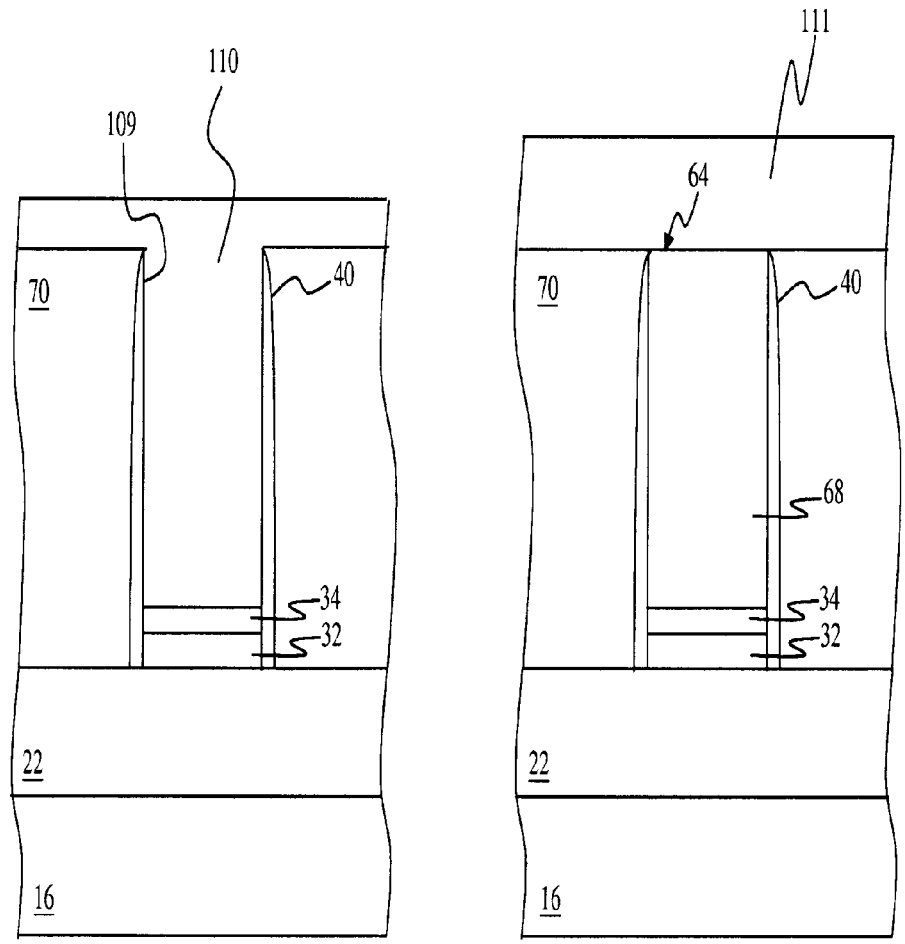

Referring now to FIGS. 22 and 23, a low resistance pure metal 110 with an n-type band edge effective work function value (n-metal) is deposited in the opening 109. Because the FinFET 107 is a short-channel device, the n-metal 110 should completely fill the opening 109. However, as mentioned above, it is possible a seam may be observed after the conformal metal fill. The n-metal 110 is conformally deposited such that it contains minimal voids or defects that may increase gate resistance. In the current embodiment, aluminum is deposited by CVD or one of its variants including HDPCVD, MOCVD, RPCVD, and PECVD. Alternatively, the n-metal may be tantalum or any other pure n-metal with low resistivity and a band edge work function. And the conformal process utilized may be ALD or any other process suitable to fill the openings without voids.

Referring now to FIGS. 24 and 25, a CMP is performed to remove portions of the n-metal 110 outside of the opening 109. A final n-type gate structure 108 is thus formed. The photoresist layer 111 is also removed. Next, a patterned photoresist layer 114 is formed over the gate structure 108. Subsequently, the polysilicon layer 68 is etched away to form the opening 41. Portions of the opening 41 over the STI regions 22 have a high-aspect ratio of approximately 5 or more.

Referring now to FIGS. 26 and 27, the low resistance pure metal 38 with an p-type band edge effective work function value (p-metal) is deposited in the opening 41. Because the FinFET 14 is a short-channel device, the p-metal 38 completely fills the opening 41. The p-metal 38 is conformally deposited such that the metal contains minimal voids or defects that may increase gate resistance. In the current embodiment, cobalt is deposited by CVD or one of its variants including HDPCVD, MOCVD, RPCVD, and PECVD. Alternatively, the p-metal may be nickel, platinum or any other pure p-metal with low resistivity and a band edge work function. And the conformal process utilized may be ALD or any other process suitable to fill the openings without voids.

Referring now to FIGS. 28 and 29, a CMP is performed to remove portions of the p-metal 38 outside of the opening 41. The final gate structure 26 is thus formed. The photoresist layer 114 is also removed.

It is understood that the semiconductor device 106 will undergo further processing to complete fabrication. For example, a not-illustrated multilayer interconnection (MLI) including metal layers (e.g., M1, M2, etc.) and inter-metal dielectric (IMD) will be formed above fin and gate structures 18, 20, 108, and 26 in order to electrically couple various device parts to form an integrated circuit. The multilayer interconnection includes vertical interconnects, such as conventional vias or contacts, and horizontal interconnects, such as metal lines. The various interconnection aspects may utilize various conductive materials including copper, tungsten and silicide. In one example, a damascene process is used to form copper multilayer interconnection structure.

Figure 30:
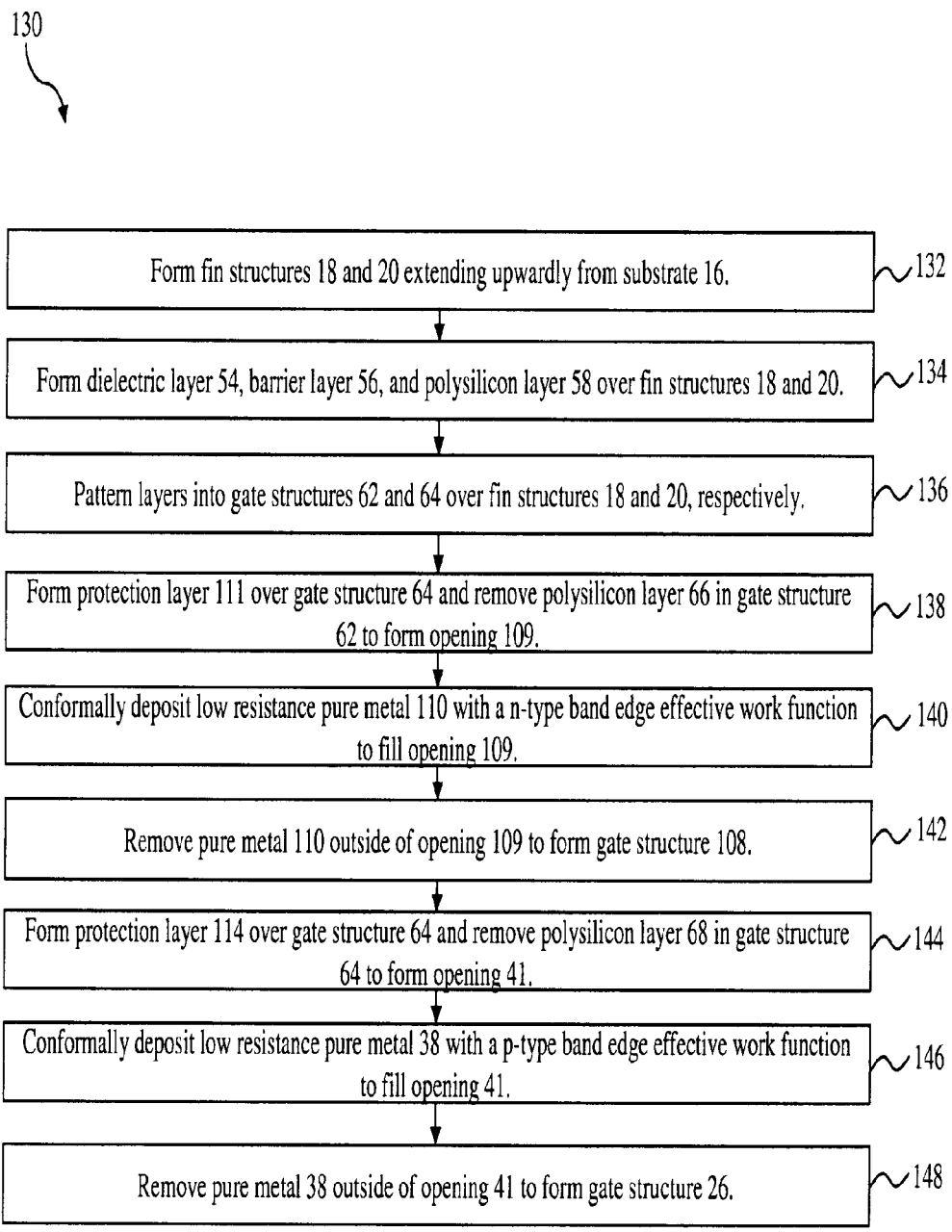
FIG. 30 is a high-level flowchart showing a process that is described in association with FIGS. 20-29.

FIG. 30 is a high-level flowchart showing the fully gate last process 130 that was described above in association with FIGS. 20-29. Process 130 begins at block 132 where the fin structures 18 and 20 are formed from the substrate 16. The STI regions 22 are also formed after the fin structures are formed. The process 130 proceeds to block 134 where the dielectric layer 54, the barrier layer 56, and the polysilicon layer 58 are formed over the fin structures 18 and 20. Then, in block 136, the layers formed in block 134 are patterned into the interim gate structures 62 and 64. The interim gate structure 62 overlays the channel region 28 of the fin structure 18 and the interim gate structure 64 overlays the channel region 30 of the fin structure 20. Also, the ILD layer 70 is deposited over the semiconductor device 10 and a CMP is performed to expose the top portions of the gate structures 62 and 64. Process 130 proceeds to block 138 where the patterned photoresist layer 111 is formed over the interim gate structure 64 and the polysilicon layer 66 is completely removed to form the opening 109. Next, in block 140, the low resistance pure metal 110 with an n-type band edge effective work function is conformally deposited in the opening 109. Process 130 proceeds to block 142 where the pure n-metal 110 outside of the opening 109 is removed thereby forming a metal gate electrode in the gate structure 108. The photoresist layer 111 is then removed. Then, in block 144, the patterned photoresist layer 114 is formed over the gate structure 108 and the polysilicon layer 68 in the interim gate structure 64 is completely removed to form the opening 41. Next, in block 146, the low resistance pure metal 38 with a p-type band edge effective work function is conformally deposited in the opening 41. Finally, process 130 proceeds to block 148 where the p-metal 38 outside of the opening 41 is removed thereby forming a metal gate electrode in the gate structure 26. The photoresist layer 114 is then removed.

The fully gate last process depicted in FIGS. 20-29 is not limited to the aspects of the process described above. For example, the polysilicon material may be removed simultaneously from the interim gate structures 62 and 64. Further, the openings 109 and 41 may be formed sequentially and the sequence of PMOS and NMOS FinFET formation may be reversed. Also, as described above, if the FinFETs 107 and 14 are long-channel devices, an additional step may be used to complete formation of the metal gate electrodes in the gate structures. Specifically, a conductive fill metal such as aluminum may be deposited to fill the remainder of openings 109 and 41.

Furthermore, the semiconductor devices 10 and 106 are not limited to the aspects and structure of the integrated circuit described above. For example, the gate structures may be spaced apart and thus electrically isolated. Further, the integrated circuits in the semiconductor devices 10 and 106 can also include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an apparatus including a substrate and a first device that includes a first projection and a first gate structure, the first projection extending upwardly from the substrate and having a first channel region therein, and the first gate structure engaging the first projection adjacent the first channel region. The first structure includes a high-k first dielectric material over the first channel region, an opening over the first dielectric material and the first channel region, and a conformal, pure metal with a low resistivity disposed in the opening. The apparatus includes a second device that includes a second projection and a second gate structure, the second projection extending upwardly from the substrate and having a second channel region therein, and the second gate structure engaging the second projection adjacent the second channel region. The second structure includes a second dielectric material over the second channel region and a silicide disposed over the second dielectric material and second channel region, wherein the silicide includes a metal that is the same metal disposed in the opening.

In another exemplary aspect, the present disclosure is directed to a semiconductor device. The semiconductor device includes a semiconductor substrate, first and second projections extending upwardly from the substrate, the projections having respective first and second channel regions therein, and a first gate structure engaging the first projection adjacent the first channel region. The first gate structure includes a first dielectric material over the first channel region, a first opening over the first dielectric material and the first channel region, and a pure first metal with an n-type work function value and a low resistivity conformally deposited in the first opening. The semiconductor device also includes a second gate structure engaging the second projection adjacent the second channel region. The second gate structure includes a second dielectric material over the second channel region, a second opening over the second dielectric material and the second channel region, and a pure second metal with a p-type work function value and a low resistivity conformally deposited in the second opening.

In yet another exemplary aspect, the present disclosure is directed to a semiconductor device. The semiconductor device includes a semiconductor substrate, a first fin-like field effect transistor (FinFET) disposed over the semiconductor substrate and including a first gate structure adjacent a first channel region, the first gate structure including a high-k dielectric layer and a silicided gate electrode. The semiconductor device also includes a short-channel second FinFET disposed adjacent the first FinFET and over the semiconductor substrate, the short-channel second FinFET including a second gate structure adjacent a second channel region, and the second gate structure including the high-k dielectric layer and a pure metal gate electrode.

What is claimed is:

1. A semiconductor device, comprising:
    a semiconductor substrate;
    first and second projections extending upwardly from the substrate, the projections having respective first and second channel regions therein;
    a first gate structure engaging the first projection adjacent the first channel region, the first gate structure including:
        a first dielectric material over the first channel region;
        a first opening over the first dielectric material and the first channel region; and
        a pure first metal with an n-type work function value and a low resistivity conformally deposited in the first opening;
    a second gate structure engaging the second projection adjacent the second channel region, the second gate structure including:
        a second dielectric material over the second channel region;
        a second opening over the second dielectric material and the second channel region; and
        a pure second metal with a p-type work function value and a low resistivity conformally deposited in the second opening.

2. A semiconductor device according to claim 1,
    wherein the pure first metal completely fills the first opening; and
    wherein the pure second metal completely fills the second opening.

3. A semiconductor device according to claim 1, wherein the pure first metal is one of aluminum (Al) and tantalum (Ta).

4. A semiconductor device according to claim 1, wherein the pure second metal is one of cobalt (Co), nickel (Ni), and platinum (Pt).

5. A semiconductor device according to claim 1,
    wherein the first and second channel regions are long channel regions;
    wherein the pure first metal fills a portion of the first opening;
    wherein the pure second metal fills a portion of the second opening; and
    including a fill metal disposed in the in remaining portions of the first and second openings.

6. A semiconductor device according to claim 1, wherein the first opening and the second opening each have a high aspect ratio.

7. A semiconductor device according to claim 1,
    wherein the first projection and first gate structure are portions of a p-type metal oxide semiconductor (PMOS) device; and
    wherein the second projection and second gate structure are portions of an n-type metal oxide semiconductor (NMOS) device.

8. A semiconductor device, comprising:
    a semiconductor substrate;
    a first short-channel fin-like field effect transistor (FinFET) disposed over the semiconductor substrate and including a first gate structure adjacent a first channel region, the first gate structure including a high-k dielectric layer and a first pure metal gate electrode composed of a first metal; and
    a second short-channel FinFET disposed adjacent the first FinFET and over the semiconductor substrate, the second short-channel FinFET including a second gate structure adjacent a second channel region, and the second gate structure including the high-k dielectric layer and a second pure metal gate electrode composed of a second metal different than the first metal.

9. A semiconductor device according to claim 8, wherein the first metal has an n-type work function value and the second metal has a p-type work function value.

10. A semiconductor device according to claim 9, wherein the first metal is one of aluminum (Al) and tantalum (Ta).

11. A semiconductor device according to claim 9, wherein the second metal is one of cobalt (Co), nickel (Ni), and platinum (Pt).

12. A semiconductor device according to claim 8, wherein the first and second pure metal gate electrodes are disposed within respective openings that each have a high-aspect ratio.

13. A semiconductor device according to claim 8, wherein the first gate structure includes a barrier layer disposed between the high-k dielectric layer and the first pure metal gate electrode.

14. A semiconductor device according to claim 13, wherein the barrier layer includes one of titanium nitride (TiN), tantalum nitride (TaN), and a metal carbide.

\* \* \* \* \*